United States Patent
Miyamoto

(10) Patent No.: US 10,395,962 B2
(45) Date of Patent: Aug. 27, 2019

(54) SUBSTRATE ARRANGEMENT APPARATUS AND SUBSTRATE ARRANGEMENT METHOD

(71) Applicant: SCREEN Holdings Co., Ltd., Kyoto (JP)

(72) Inventor: Yukiteru Miyamoto, Kyoto (JP)

(73) Assignee: SCREEN Holdings Co., Ltd. (JP)

( * ) Notice: Subject to any disclaimer, the term of this patent is extended or adjusted under 35 U.S.C. 154(b) by 27 days.

(21) Appl. No.: 15/694,433

(22) Filed: Sep. 1, 2017

(65) Prior Publication Data

US 2018/0090359 A1 Mar. 29, 2018

(30) Foreign Application Priority Data

Sep. 29, 2016 (JP) ................. 2016-190862

(51) Int. Cl.
*H01L 21/77* (2017.01)
*H01L 21/677* (2006.01)
(Continued)

(52) U.S. Cl.
CPC ...... *H01L 21/67796* (2013.01); *B65G 49/061* (2013.01); *B65G 49/063* (2013.01);
(Continued)

(58) Field of Classification Search
CPC ......... H01L 21/67796; H01L 21/67288; H01L 21/67313; H01L 21/67781;
(Continued)

(56) References Cited

U.S. PATENT DOCUMENTS 4,695,217 A * 9/1987 Lau ................... H01L 21/67313
   294/87.1
4,856,957 A * 8/1989 Lau ................... H01L 21/67781
   414/404
(Continued)

FOREIGN PATENT DOCUMENTS

JP   H07-307319 A   11/1995
JP   2002-329767 A  11/2002
(Continued)

*Primary Examiner* — Gregory W Adams
(74) *Attorney, Agent, or Firm* — Ostrolenk Faber LLP

(57) ABSTRACT

In a substrate arrangement apparatus, a holder elevating mechanism disposes each first substrate between each pair of second substrates, with the first and second substrates being alternately arranged front-to-front and back-to-back. Each substrate is curved in a first radial direction to one side in a thickness direction with a minimum curvature, and curved in a second radial direction orthogonal to the first radial direction to the one side in the thickness direction with a maximum curvature. The first radial direction of the first substrates, each arranged between each pair of the second substrates, is approximately orthogonal to the first radial direction of the second substrates. This improves uniformity in the up-down direction of the distance in the direction of arrangement between the first and second substrates that are alternately arranged adjacent to each other in the direction of arrangement.

23 Claims, 8 Drawing Sheets

(51) Int. Cl.
*B65G 49/06* (2006.01)
*H01L 21/67* (2006.01)
*H01L 21/673* (2006.01)

(52) U.S. Cl.
CPC ...... *B65G 49/067* (2013.01); *H01L 21/67288* (2013.01); *H01L 21/67313* (2013.01); *H01L 21/67781* (2013.01)

(58) Field of Classification Search
CPC ........ H01L 21/67383; H01L 21/67766; B65G 49/061; B65G 49/063; B65G 49/067; Y10S 414/137
USPC ........................................................ 414/217
See application file for complete search history.

(56) References Cited

U.S. PATENT DOCUMENTS

| | | | | |
|---|---|---|---|---|
| 4,987,407 A * | 1/1991 | Lee | .................. | H01L 21/67265 340/540 |
| 6,138,695 A * | 10/2000 | Shibao | .............. | H01L 21/67313 134/147 |
| 6,612,801 B1 * | 9/2003 | Koguchi | ........... | H01L 21/67028 414/404 |
| 6,755,603 B2 * | 6/2004 | Yamahata | ......... | H01L 21/67781 414/225.01 |
| 6,769,855 B2 * | 8/2004 | Yokomori | ......... | H01L 21/67781 414/416.02 |
| 7,337,792 B2 * | 3/2008 | Kamikawa | ......... | H01L 21/67781 134/148 |
| 7,404,409 B2 * | 7/2008 | Kamikawa | ......... | H01L 21/67766 134/125 |
| 8,033,288 B2 * | 10/2011 | Shiomi | ............. | H01L 21/67075 134/157 |
| 8,133,002 B2 * | 3/2012 | Jonas | ................ | H01L 21/67098 414/404 |
| 8,851,821 B2 * | 10/2014 | Mitsuyoshi | .......... | B65G 49/061 414/416.08 |
| 2002/0031421 A1 * | 3/2002 | Egashira | ........... | H01L 21/67781 414/225.01 |
| 2002/0146309 A1 * | 10/2002 | Di Cesare | ........ | H01L 21/67778 414/416.08 |
| 2010/0068014 A1 | 3/2010 | Mitsuyoshi et al. | ..... | 414/225.01 |
| 2010/0272544 A1 * | 10/2010 | Rivollier | ........... | H01L 21/67766 414/222.01 |
| 2014/0147800 A1 * | 5/2014 | Alexander | ........ | H01L 21/67109 432/253 |
| 2018/0090360 A1 * | 3/2018 | Miyamoto | .............. | H01L 21/68 |

FOREIGN PATENT DOCUMENTS

| | | |
|---|---|---|
| JP | 2008-078544 A | 4/2008 |
| JP | 2010-93230 A | 4/2010 |
| KR | 10-1373071 B1 | 3/2014 |

* cited by examiner (COMPARATIVE EXAMPLE)

(COMPARATIVE EXAMPLE)

SUBSTRATE ARRANGEMENT APPARATUS AND SUBSTRATE ARRANGEMENT METHOD

TECHNICAL FIELD

The present invention relates to a technique for arranging a plurality of substrates.

BACKGROUND ART

Substrate processing apparatuses that perform various types of processing on substrates have conventionally been used in the process of manufacturing semiconductor substrates (hereinafter, simply referred to as "substrates"). For example, Japanese Patent Application Laid-Open No. 2010-93230 (Document 1) discloses a batch-type substrate processing apparatus that processes a plurality of substrates by one operation. With this substrate processing apparatus, a plurality of substrates held in a horizontal posture and arranged along the thickness (hereinafter, referred to as a "thickness direction") of the substrates are carried into the apparatus by a batch hand. Then, a posture changing mechanism changes the posture of the plurality of substrates to a vertical posture at once and then collectively transfers the substrates to a pusher. Moreover, a new plurality of substrates are carried into the apparatus, and after the posture of these substrates are changed to a vertical posture, the substrates are transferred at once to the pusher that already holds another plurality of substrates. At this time, each of the substrates already held by the pusher (hereinafter, referred to as a "first substrate group") is disposed between each pair of the new substrates (hereinafter, referred to as a "second substrate group").

This substrate processing apparatus also includes a substrate-direction alignment mechanism for aligning the directions of a plurality of substrates that are held in a vertical posture by a chuck. The substrate-direction alignment mechanism aligns a plurality of substrates so that the orientations (i.e., circumferential positions) of notches provided in peripheral portions of the substrates match one another.

Japanese Patent Application Laid-Open No. 2008-78544 (Document 2) discloses an example of the structure of a substrate alignment apparatus. This substrate alignment apparatus aligns a plurality of substrates by rotating a plurality of substrates held in a vertical posture via a driving roller and stopping the rotation when a notch of each substrate has engaged with an engagement shaft that extends in the direction of arrangement of the substrates.

Meanwhile, a method for manufacturing a semiconductor disclosed in Japanese Patent Application Laid-Open No. H7-307319 (Document 3) aims to prevent, for example, the development of flaws caused by contact between a plurality of wafers due to the wafers possibly becoming warped during heat treatment. In the method, a plurality of wafers are classified according to their direction of warpage, and wafers warped in the same direction are housed in a single port and subjected together to heat treatment.

By the way, substrates processed by a substrate processing apparatus may be warped under the influence of processing performed before transport to the substrate processing apparatus, as described in Document 3. The sizes in the thickness direction of warped substrates are larger than those of flat substrates. When each of the substrates in the first substrate group is disposed between each pair of the substrates in the second substrate group as in Document 1 and if, for example, the substrates in the first substrate group and the substrates in the second substrate group are warped and convex in opposite directions, adjacent substrates may come into contact with one another due to the presence of portions where the distance between adjacent substrates is small.

SUMMARY OF INVENTION

The present invention is intended for a substrate arrangement apparatus, and it is an object of the present invention to improve uniformity in distance between adjacent substrates. The present invention is also intended for a substrate arrangement method.

A substrate arrangement apparatus for arranging a plurality of substrates according to the present invention includes a first holder for holding lower edge portions of a plurality of first substrates in a vertical posture, the plurality of first substrates being arranged in a thickness direction of the plurality of first substrates, a second holder for holding lower edge portions of a plurality of second substrates in a vertical posture, the plurality of second substrates being arranged in a thickness direction of the plurality of second substrates, a substrate alignment mechanism for rotating at least one substrate group out of first and second substrate groups in a circumferential direction to determine a circumferential orientation of the at least one substrate group, the first substrate group consisting of the plurality of first substrates, and the second substrate group consisting of the plurality of second substrates, and a substrate arrangement mechanism for bringing the first holder relatively close to the second holder to dispose each of the plurality of first substrates in the first substrate group between each pair of the plurality of second substrates in the second substrate group, with the plurality of first substrates and the plurality of second substrates alternately disposed front-to-front and back-to-back. Each substrate in the first and second substrate groups is curved in a first radial direction to one side in the thickness direction with a minimum curvature, and is curved in a second radial direction to the one side in the thickness direction with a maximum curvature, the second radial direction being orthogonal to the first radial direction with an angle that is greater than or equal to 45 degree and less than or equal to 135 degrees. The first radial direction of the plurality of first substrates, each disposed between each pair of the plurality of second substrates, is orthogonal to the first radial direction of the plurality of second substrates. With this substrate arrangement apparatus, it is possible to improve uniformity in distance between adjacent substrates.

In a preferred embodiment of the present invention, the substrate alignment mechanism rotates both of the first and second substrate groups in the circumferential direction to determine circumferential orientations of the first and second substrate groups.

In another preferred embodiment of the present invention, the first radial direction of the plurality of first substrates held by the first holder points in an up-down direction, the first radial direction of the plurality of second substrates held by the second holder points in a horizontal direction, and the substrate arrangement mechanism brings the first holder relatively close to the second holder from underside to insert the plurality of first substrates from the underside among the plurality of second substrates.

In another preferred embodiment of the present invention, the first radial direction of the plurality of first substrates held by the first holder points in a horizontal direction, the first radial direction of the plurality of second substrates held by the second holder points in an up-down direction, and the substrate arrangement mechanism brings the first holder relatively close to the second holder from underside to insert the plurality of first substrates from the underside among the plurality of second substrates.

These and other objects, features, aspects and advantages of the present invention will become more apparent from the following detailed description of the present invention when taken in conjunction with the accompanying drawings.

DESCRIPTION OF EMBODIMENTS

Figure 1:
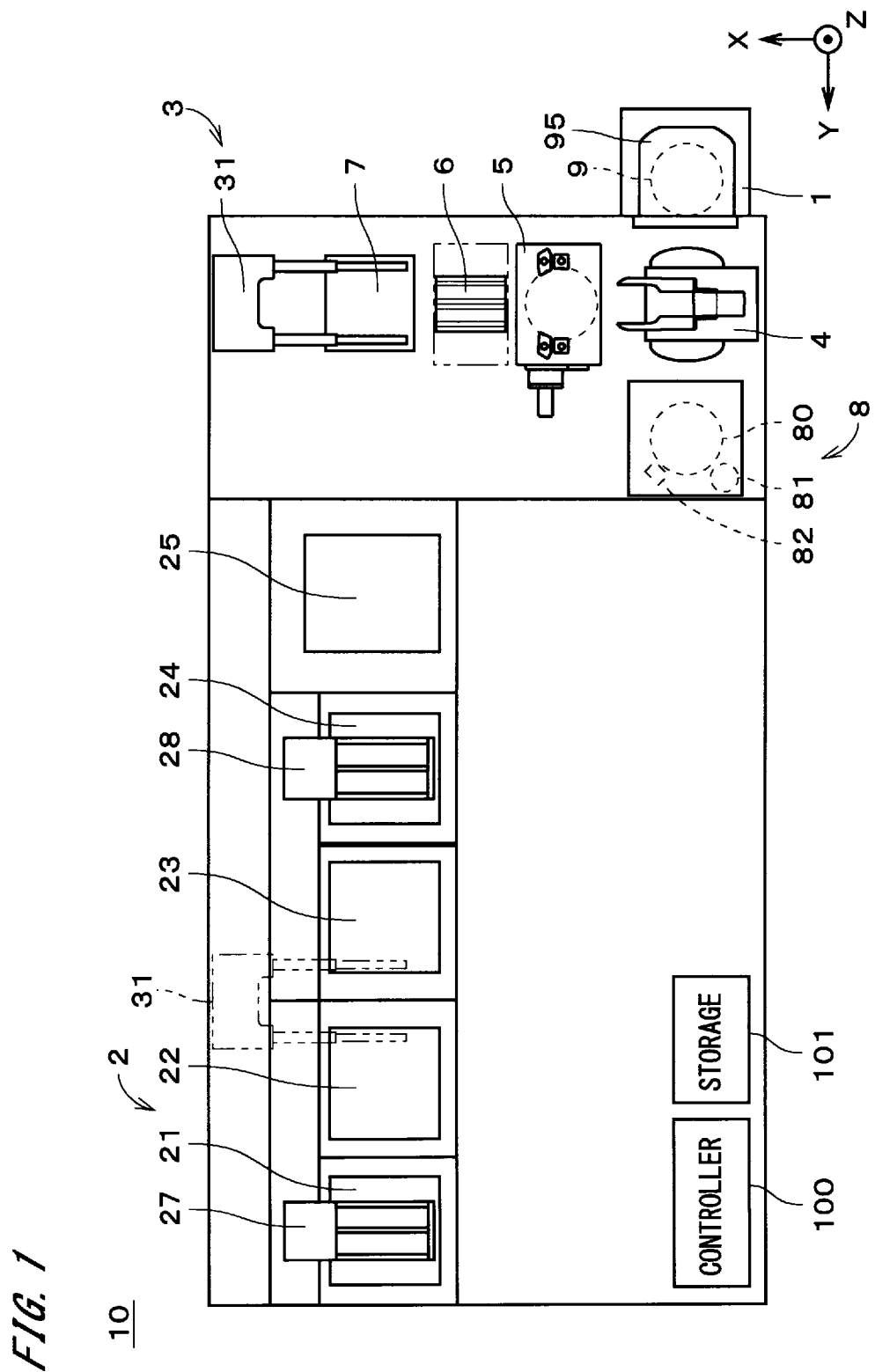
FIG. 1 is a plan view of a substrate processing apparatus according to an embodiment.

FIG. 1 is a plan view of a substrate processing apparatus 10 according to an embodiment of the present invention. The substrate processing apparatus 10 has an approximately rectangular shape in plan view. The substrate processing apparatus 10 is a batch-type substrate processing apparatus that processes a plurality of semiconductor substrates 9 (hereinafter, simply referred to as "substrates 9") by one operation. The substrates 9 are approximately disc-like substrates. Each substrate 9 has a notch 93 (see FIG. 4) indicating a crystal orientation in its peripheral portion. The notch 93 has a depth of approximately 1 mm from the outer periphery of the substrate 9.

The substrate processing apparatus 10 includes a FOUP holder 1, a substrate processing part 2, a main transport mechanism 3, a carry-in-and-out mechanism 4, a posture changing mechanism 5, a pusher 6, a delivery mechanism 7, a substrate alignment mechanism 8, a controller 100, and a storage 101. The controller 100 controls operations or other activities of each constituent element of the substrate processing apparatus 10. The controller 100 is a general computer system that includes, for example, a CPU that performs various types of computations, a ROM that stores basic programs, and a RAM that stores various types of information. The FOUP holder 1 is disposed at one corner of the substrate processing apparatus 10. The FOUP holder 1 holds a FOUP 95. The FOUP 95 is a container that houses a plurality of (e.g., 25) substrates 9 in a horizontal posture, with the substrates 9 being stacked in the Z direction.

The Z direction in FIG. 1 is a direction parallel to the direction of gravity, and is also referred to as an "up-down direction." The X direction in FIG. 1 is a direction perpendicular to the Z direction. The Y direction is a direction perpendicular to the X and Y directions. A horizontal posture of the substrates 9 refers to a posture in which the direction of the normal to the main surfaces of the substrates 9 points approximately in the Z direction. A vertical posture of the substrates 9, which will be described later, refers to a posture in which the direction of the normal to the main surfaces of the substrates 9 points in a direction approximately perpendicular to the Z direction. In the substrate processing apparatus 10, a plurality of substrates 9 are stacked in either a horizontal or vertical posture in a direction approximately perpendicular to the main surfaces of the substrates 9. In other words, a plurality of substrates 9 in a horizontal or vertical posture are arranged in the thickness direction of the substrates 9.

Figure 2:
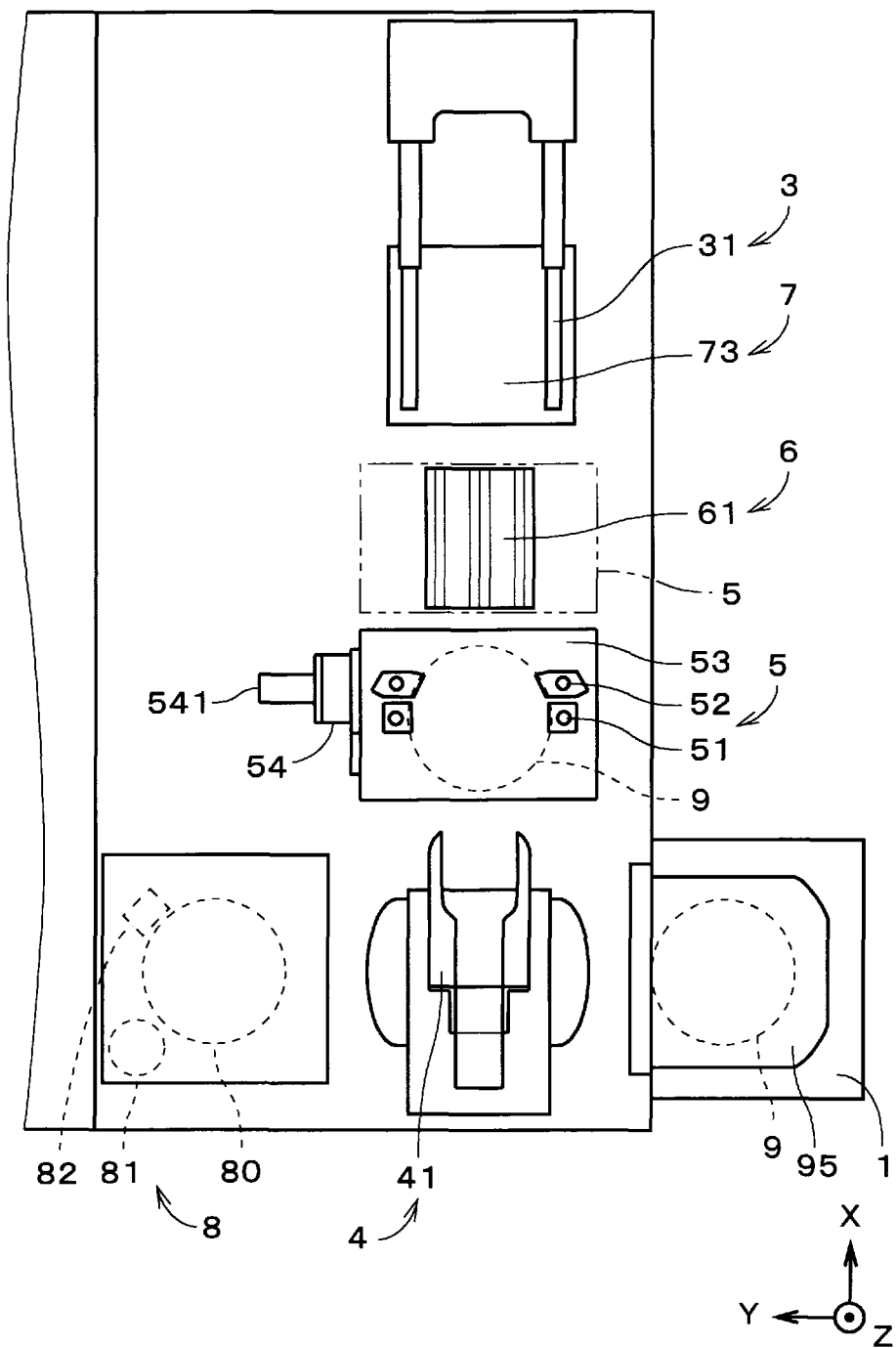
FIG. 2 is a plan view of part of the substrate processing apparatus.
Figure 3:
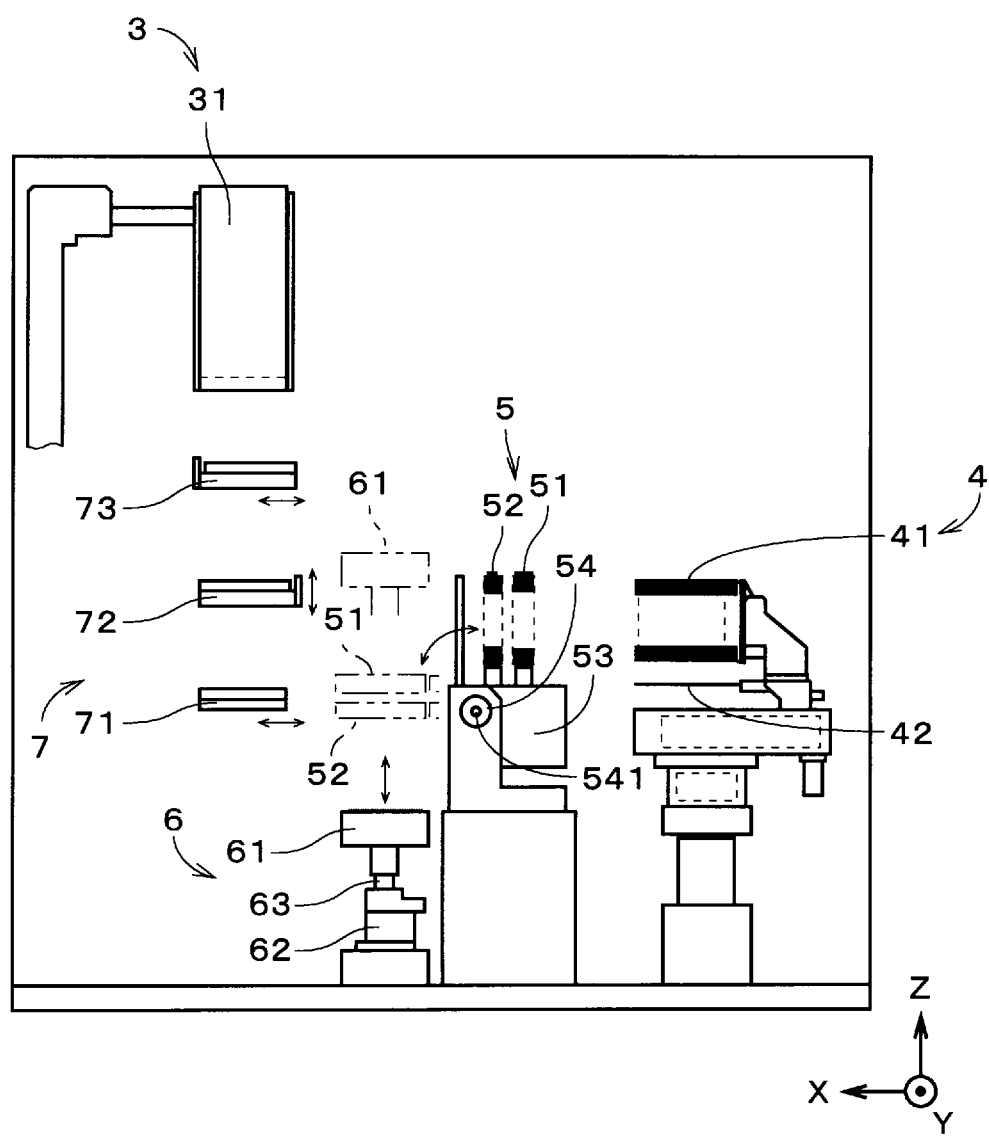
FIG. 3 is a side view of part of the substrate processing apparatus.

FIG. 2 is an enlarged plan view of a portion on the −Y side of the substrate processing apparatus 10. FIG. 3 is a side view of the portion on the −Y side of the substrate processing apparatus 10. In the substrate processing apparatus 10, the carry-in-and-out mechanism 4 is disposed on the +Y side of the FOUP holder 1 and opposes the FOUP holder 1 in the Y direction as illustrated in FIG. 2. The substrate alignment mechanism 8 is disposed on the +Y side of the carry-in-and-out mechanism 4. The FOUP holder 1 and the substrate alignment mechanism 8 are not shown in FIG. 3.

As illustrated in FIGS. 2 and 3, the posture changing mechanism 5 is disposed on the +X side of the carry-in-and-out mechanism 4. The pusher 6 is disposed on the +X side of the posture changing mechanism 5. The delivery mechanism 7 and the main transport mechanism 3 are disposed on the +X side of the pusher 6. In the state illustrated in FIG. 3, the main transport mechanism 3 is located on the +Z side of (i.e., above) the delivery mechanism 7. The substrate processing part 2 is disposed on the +Y side of the main transport mechanism 3 as illustrated in FIG. 1.

The substrate processing part 2 includes a first liquid chemical tank 21, a first rinsing liquid tank 22, a second liquid chemical tank 23, a second rinsing liquid tank 24, a dry processing part 25, a first lifter 27, and a second lifter 28. The first liquid chemical tank 21, the first rinsing liquid tank 22, the second liquid chemical tank 23, the second rinsing liquid tank 24, and the dry processing part 25 are aligned in the Y direction from the +Y side to the −Y side in the specified order. The first liquid chemical tank 21 and the second liquid chemical tank 23 retain liquid chemicals of the same type or different types. The first rinsing liquid tank 22 and the second rinsing liquid tank 24 each retain a rinsing liquid (e.g., deionized water).

When the substrate processing apparatus 10 processes substrates 9, a FOUP 95 that houses a plurality of (e.g., 25) substrates 9 in a horizontal posture is first prepared. Then, one of the plurality of (e.g., 25) substrates housed in the FOUP 95 is held by a single-substrate hand 42 of the carry-in-and-out mechanism 4 illustrated in FIGS. 2 and 3 and carried out of the FOUP 95. The single-substrate hand 42 holds a single substrate 9 in a horizontal posture. The carry-in-and-out mechanism 4 also includes a batch hand 41 that collectively holds a plurality of substrates 9 arranged in the Z direction in a horizontal posture.

Then, the single-substrate hand 42 rotates horizontally and moves ahead toward the substrate alignment mechanism 8 so that the single substrate 9 is transferred from the carry-in-and-out mechanism 4 to the substrate alignment mechanism 8. The substrate alignment mechanism 8 determines the circumferential position of the substrate 9 by rotating the substrate 9 in the circumferential direction to change the circumferential orientation of the substrate 9.

The substrate alignment mechanism 8 includes a substrate supporter 80, a motor 81, and a sensor 82. The substrate supporter 80 rotatably supports a substrate 9 in a horizontal posture. The motor 81 is a rotor that rotates a substrate 9 along with the substrate supporter 80. The sensor 82 acquires the angular position of a rotating substrate 9 (i.e., circumferential orientation of the substrate 9) by optically detecting the notch 93 of the substrate 9 supported by the substrate supporter 80. In the substrate alignment mechanism 8, the motor 81 rotates the substrate 9 supported by the substrate supporter 80 in the circumferential direction to change the circumferential orientation of the substrate 9. Then, the sensor 82 detects the notch 93 of the rotating substrate 9, and the motor 81 is stopped with predetermined timing after the detection (i.e., after the elapse of a predetermined period of time since the detection of the notch 93). Note that the predetermined period of time may be zero. In this way, the rotation of the substrate 9 is stopped when the notch 93 of the substrate 9 is located at a predetermined position. That is, the notch 93 of the substrate 9 is aligned in the circumferential direction. The substrate alignment mechanism 8 is a notch-position changing mechanism for changing the circumferential position of the notch 93 of the substrate 9.

When the substrate alignment mechanism 8 has determined the circumferential position of the substrate 9, the substrate 9 is carried out of the substrate alignment mechanism 8 by the single-substrate hand 42 and returned to the FOUP 95 on the FOUP holder 1. Subsequently, in the same manner, the next substrate 9 is taken out of the FOUP 95, and then returned to the FOUP 95 after the substrate alignment mechanism 8 has determined the circumferential position of the substrate 9 (i.e., the notch 93 is aligned in the circumferential direction). By repeating this operation for all of the substrates 9 in the FOUP 95, the circumferential orientations of the substrates 9 in the FOUP 95 are changed, and the circumferential positions of the substrates 9 are determined. In other words, these substrates 9 are aligned in the circumferential direction.

In the operation of determining the circumferential positions of the substrates 9, the notches 93 of all of the substrates 9 housed in the FOUP 95 may be located at the same circumferential position, or may be located at different circumferential positions. For example, the circumferential position of the notch 93 of each odd-numbered substrate 9 in the alignment direction of the substrates 9 may be set to a first predetermined position, and the circumferential position of the notch 93 of each even-numbered substrate 9 in the alignment direction may be set to a second predetermined position different from the first predetermined position.

When the substrate alignment mechanism 8 has completed the alignment of the substrates 9 (i.e., alignment in the circumferential direction of the notches 93), the substrates 9 are transported out of the FOUP 95 by the batch hand 41 of the carry-in-and-out mechanism 4. The batch hand 41 then rotates horizontally and moves ahead toward the posture changing mechanism 5 so that the substrates 9 are transferred from the carry-in-and-out mechanism 4 to the posture changing mechanism 5. The posture changing mechanism 5 collectively holds the plurality of substrates 9, which are stacked in the Z direction in a horizontal posture, with a horizontal holder 51. The posture changing mechanism 5 causes a holder rotation mechanism 54 to rotate the plurality of substrates 9 by 90 degrees in the counterclockwise direction in FIG. 3 about a rotational shaft 541 pointing in the Y direction, along with the horizontal holder 51, a vertical holder 52, and a mounting block 53. This rotation changes the posture of the substrates 9 at once from horizontal to vertical. The substrates 9 in a vertical posture are collectively held by the vertical holder 52.

Then, an up-and-down holder 61 is moved upward by driving a holder elevating mechanism 62 of the pusher 6, and receives and holds the substrates 9 from the vertical holder 52 indicated by the dashed double-dotted line in FIG. 3. That is, the substrates 9 held in a vertical posture are transferred between the vertical holder 52 and the pusher 6. The up-and-down holder 61 collectively holds the substrates 9 that are arranged (i.e., stacked) approximately in the X direction in a vertical posture. When the horizontal holder 51 and the vertical holder 52 of the posture changing mechanism 5 are rotated by 90 degrees in the clockwise direction in FIG. 3 and retracted from above the holder elevating mechanism 62, the up-and-down holder 61 is rotated horizontally by 180 degrees about a rotational shaft 63 pointing in the Z direction and then moved down by the holder elevating mechanism 62. Accordingly, the positions in the stacking direction of the substrates 9 are shifted by a half of the pitch of the substrates 9 (i.e., a half of the distance in the stacking direction between two adjacent substrates 9, which is hereinafter referred to as a "half pitch") from the positions before the rotation.

Thereafter, in the same procedure as described above, a new plurality of (e.g., 25) substrates 9 housed in the FOUP 95 are transferred from the carry-in-and-out mechanism 4 to the posture changing mechanism 5 after sequentially aligned in the circumferential direction by the substrate alignment mechanism 8. The posture changing mechanism 5 collectively changes the posture of the new substrates 9 from horizontal to vertical. Then, the up-and-down holder 61 of the pusher 6 is again moved upward and receives and holds the new substrates 9 from the posture changing mechanism 5. At this time, the substrates 9 already held by the up-and-down holder 61 (hereinafter, referred to as a "first substrate group") are inserted among the new substrates 9 (hereinafter, referred to as a "second substrate group") from the underside. In this way, the posture changing mechanism 5 and the pusher 6 carry out batch assembly in which a batch is formed by combining the first substrate group and the second substrate group.

As described above, the substrates 9 (hereinafter, also referred to as "first substrates 9") in the first substrate group are rotated by 180 degrees (i.e., turned around) before their insertion into the second substrate group. Thus, each of the first substrates 9 in the first substrate group is disposed between each pair of the substrates 9 (hereinafter, also referred to as "second substrates 9") in the second substrate group, with the first substrates 9 and the second substrates 9 alternately arranged front-to-front and back-to-back. In other words, each pair of adjacent substrates 9 among the plurality of (e.g., 50) substrates 9 held by the up-and-down holder 61 are disposed such that their front surfaces or their rear surfaces face each other (i.e., they are in a face-to-face situation). The front surfaces of the substrates 9 may be main surfaces where circuit patterns are formed, and the rear surfaces of the substrates 9 may be main surfaces on the side opposite to the front surfaces.

Alternatively, when the up-and-down holder 61 that holds the first substrate group is only moved horizontally by the half pitch in the direction of arrangement of the substrates 9 without being rotated by 180 degrees before receipt of the second substrate group, the pusher 6 may carry out batch assembly in a state in which each pair of adjacent substrates 9 is disposed such that their front and rear surfaces face each other (i.e., they are in a face-to-back situation).

The substrates 9 assembled into a batch on the up-and-down holder 61 are transferred from the up-and-down holder 61 to a carry-in chuck 71 of the delivery mechanism 7. The carry-in chuck 71 moves in the +X direction from above the holder elevating mechanism 62 while holding the received substrates 9 in a vertical posture. Subsequently, an intermediate chuck 72 of the delivery mechanism 7 moves downward to receive the substrates 9 from the carry-in chuck 71, and then moves upward. Then, a substrate chuck 31 of the main transport mechanism 3 receives the substrates 9 from the intermediate chuck 72. The substrate chuck 31 holds the substrates 9 that are arranged in the X direction in a vertical posture.

The main transport mechanism 3 transports the unprocessed substrates 9 held by the substrate chuck 31 in the +Y direction and positions the substrates 9 above the first lifter 27 of the substrate processing part 2 illustrated in FIG. 1. The first lifter 27 collectively receives the substrates 9, which are arranged in the X direction in a vertical posture, from the substrate chuck 31. The first lifter 27 moves the substrates 9 down into the first liquid chemical tank 21 and collectively immerses the substrates 9 in the liquid chemical retained in the first liquid chemical tank 21. Immersing the substrates 9 in the liquid chemical for a predetermined period of time completes liquid chemical processing performed on the substrates 9.

The first lifter 27 then pulls the substrates 9 up out of the first liquid chemical tank 21 and moves in the −Y direction. The first lifter 27 moves the substrates 9 down into the first rinsing liquid tank 22 and collectively immerses the substrates 9 in the rinsing liquid retained in the first rinsing liquid tank 22. Immersing the substrates 9 in the rinsing liquid for a predetermined period of time completes rinsing processing performed on the substrates 9. After the rinsing processing has completed, the first lifter 27 pulls the substrates 9 up out of the first rinsing liquid tank 22. The substrate chuck 31 of the main transport mechanism 3 collectively receives the substrates 9 from the first lifter 27 and moves to above the second lifter 28.

Like the first lifter 27, the second lifter 28 collectively receives the substrates 9 from the substrate chuck 31 and collectively immerses the substrates 9 in the liquid chemical retained in the second liquid chemical tank 23. After the liquid chemical processing performed on the substrates 9 has completed, the second lifter 28 pulls the substrates 9 up out of the second liquid chemical tank 23 and collectively immerses the substrates 9 in the rinsing liquid retained in the second rinsing liquid tank 24. After the rinsing processing performed on the substrates 9 has completed, the second lifter 28 pulls the substrates 9 up out of the second rinsing liquid tank 24. The substrate chuck 31 of the main transport mechanism 3 collectively receives the substrates 9 from the second lifter 28 and moves to above the dry processing part 25.

The dry processing part 25 collectively receives the substrates 9 from the substrate chuck 31 and performs dry processing on the substrates 9 at once. The dry processing involves, for example, supplying an organic solvent (i.e., isopropyl alcohol) to the substrates 9 in a reduced-pressure atmosphere and rotating the substrates 9 to remove the liquids on the substrates 9 by centrifugal force. After the dry processing performed on the substrates 9 has completed, the substrate chuck 31 of the main transport mechanism 3 collectively receives the processed substrates 9 from the dry processing part 25 and moves in the −Y direction.

Then, a delivery chuck 73 of the delivery mechanism 7 illustrated in FIGS. 2 and 3 collectively receives the substrates 9 from the substrate chuck 31 of the main transport mechanism 3 and moves in the −X direction to position the substrates 9 above the up-and-down holder 61 of the pusher 6. The up-and-down holder 61 of the pusher 6 moves upward and receives the substrates 9 from the delivery chuck 73. The up-and-down holder 61 holds the plurality of (e.g., 50) substrates 9 arranged in the X direction in a vertical posture.

Next, the up-and-down holder 61 moves downward to transfer the substrates 9 in a vertical posture between the pusher 6 and the vertical holder 52. More specifically, among the substrates 9, the plurality of (e.g., 25) substrates 9 in the second substrate group are transferred to the vertical holder 52 indicated by the dashed double-dotted line in FIG. 3. In other words, the batch of the first substrate group and the second substrate group is disassembled, and the first substrate group and the second substrate group are separated from each other. The horizontal holder 51 and the vertical holder 52 of the posture changing mechanism 5 are rotated by 90 degrees in the clockwise direction in FIG. 3. This rotation changes the posture of the substrates 9 in the second substrate group at once from vertical to horizontal. These substrates 9 are collectively held by the horizontal holder 51 while being stacked in the Z direction in a horizontal posture. Then, the batch hand 41 of the carry-in-and-out mechanism 4 receives the substrates 9 from the horizontal holder 51 and carries the substrates 9 into the FOUP 95. The FOUP 95 into which the processed substrates 9 have been carried is replaced with a new FOUP 95.

When the posture changing mechanism 5 has changed the posture of the substrates 9 in the second substrate group from vertical to horizontal as described above, the up-and-down holder 61 that holds the plurality of (e.g., 25) substrates 9 in the first substrate group is moved upward. The horizontal holder 51 and the vertical holder 52 that have transferred the substrates 9 in the second substrate group to the carry-in-and-out mechanism 4 are rotated by 90 degrees in the counterclockwise direction in FIG. 3.

Then, the up-and-down holder 61 is again moved downward to transfer the substrates 9 in a vertical posture between the pusher 6 and the vertical holder 52. More specifically, the substrates 9 in the first substrate group are transferred to the vertical holder 52 indicated by the dashed double-dotted line in FIG. 3. The horizontal holder 51 and the vertical holder 52 are again rotated by 90 degrees in the clockwise direction in FIG. 3. This rotation changes the posture of the substrates 9 in the first substrate group at once from vertical to horizontal. These substrates 9 are collectively held by the horizontal holder 51 while being stacked in the Z direction in a horizontal posture. Then, the batch hand 41 of the carry-in-and-out mechanism 4 receives the substrates 9 from the horizontal holder 51 and carries the substrates 9 into the FOUP 95. Note that the posture changing mechanism 5 may first receive the first substrate group and then receive the second substrate group in the operation of moving the substrates 9 from the pusher 6 to the posture changing mechanism 5.

The posture changing mechanism 5 and the pusher 6 change the posture of the substrates 9 from horizontal to vertical or from vertical to horizontal as described above under the control of the controller 100. In other words, the posture changing mechanism 5, the pusher 6, and the controller 100 serve as a posture changing device that changes the posture of the substrates 9 from one of horizontal and vertical postures to the other posture.

While the substrate processing apparatus 10 illustrated in FIGS. 1 to 3 performs processing on the substrates 9 having an approximately disc-like shape as described above, these substrates 9 may be warped under the influence of processing (i.e., pre-processing) performed before transport of the substrates to the substrate processing apparatus 10. Although various types of warpage may occur in the substrates 9, a plurality of substrates 9 housed in a single FOUP 95 are generally warped in the same way. More specifically, when the positions of the notches 93 are used as a reference, the substrates 9 are in the same warped state. The warped state of the substrates 9 indicates information including the orientation of the warp in the substrates 9 (e.g., orientation in which the substrate is convex on the front surface side) and the magnitude of the warp in the substrates 9.

Figure 4:
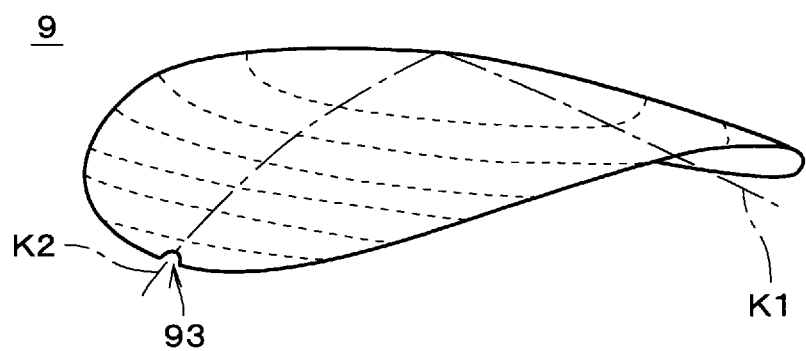
FIG. 4 is a perspective view of a substrate.

FIG. 4 is a perspective view illustrating an example of a warped substrate. The substrate 9 in FIG. 4 is curved in a first radial direction K1 to one side in the thickness direction (i.e., direction in which the substrate is convex upward in FIG. 4) with a first curvature. The substrate 9 is also curved in a second radial direction K2 orthogonal to the first radial direction K1 to the one side in the thickness direction (i.e., the same direction as the direction of the curve in the first radial direction K1) with a second curvature. In the example in FIG. 4, the first curvature in the first radial direction K1 is a minimum curvature among the curvatures in each radial direction of the substrate 9, and hereinafter also referred to as a "minimum curvature." The second curvature in the second radial direction K2 is a maximum curvature among the curvatures in each radial direction of the substrate 9, and hereinafter also referred to as a "maximum curvature." The minimum and maximum curvatures are both positive.

In the following description, when each substrate 9 is held in a vertical posture, the distance in the thickness direction between a point of the substrate 9 that is closest to the one side in the thickness direction and a point of the substrate 9 that is closest to the other side in the thickness direction is referred to as a "size in the thickness direction" of the substrate 9. When the substrate 9 is flat and not warped, the size in the thickness direction of the substrate 9 is the same as the thickness of the substrate 9. For example, the size in the thickness direction of a warped substrate 9 may be greater than that of a flat substrate 9 by approximately 0.5 mm.

Figure 5:
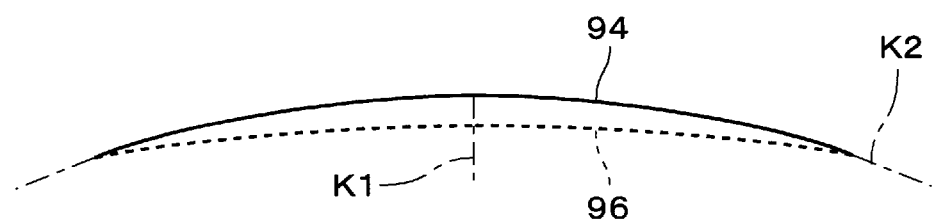
FIG. 5 is a side view of the substrate.
Figure 6:
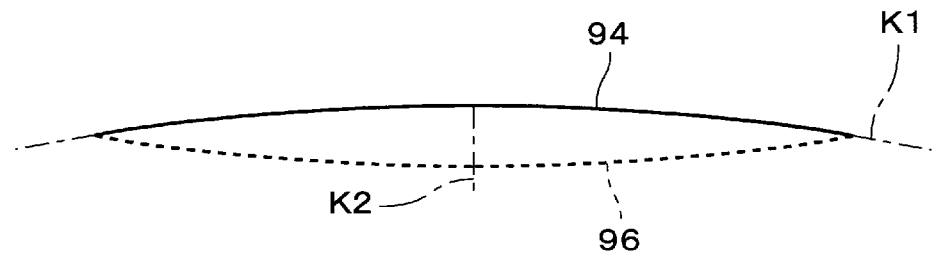
FIG. 6 is a side view of the substrate.

FIG. 5 is a side view of the substrate 9 illustrated in FIG. 4 when viewed in the first radial direction K1 (i.e., in the direction perpendicular to the second radial direction K2). FIG. 6 is a side of the substrate 9 illustrated in FIG. 4 when viewed in the second radial direction K2 (i.e., in the direction perpendicular to the first radial direction K1). In FIGS. 5 and 6, the upper curve of the substrate 9 indicates a surface 94 of the substrate 9, and the lower curve of the substrate 9 indicates an outer peripheral edge 96 of the substrate 9. To facilitate distinction between the surface 94 and the outer peripheral edge 96, the outer peripheral edge 96 is indicated by broken lines in FIGS. 5 and 6. When the substrate 9 is viewed in the first radial direction K1 as illustrated in FIG. 5, the outer peripheral edge 96 of the substrate 9 and the surface 94 of the substrate 9 are convex in the same direction (i.e., upward). When the substrate 9 is viewed in the second radial direction K2 as illustrated in FIG. 6, the outer peripheral edge 96 of the substrate 9 is convex in the opposite direction (i.e., downward) to the direction in which the surface 94 of the substrate 9 is convex.

Figure 7:
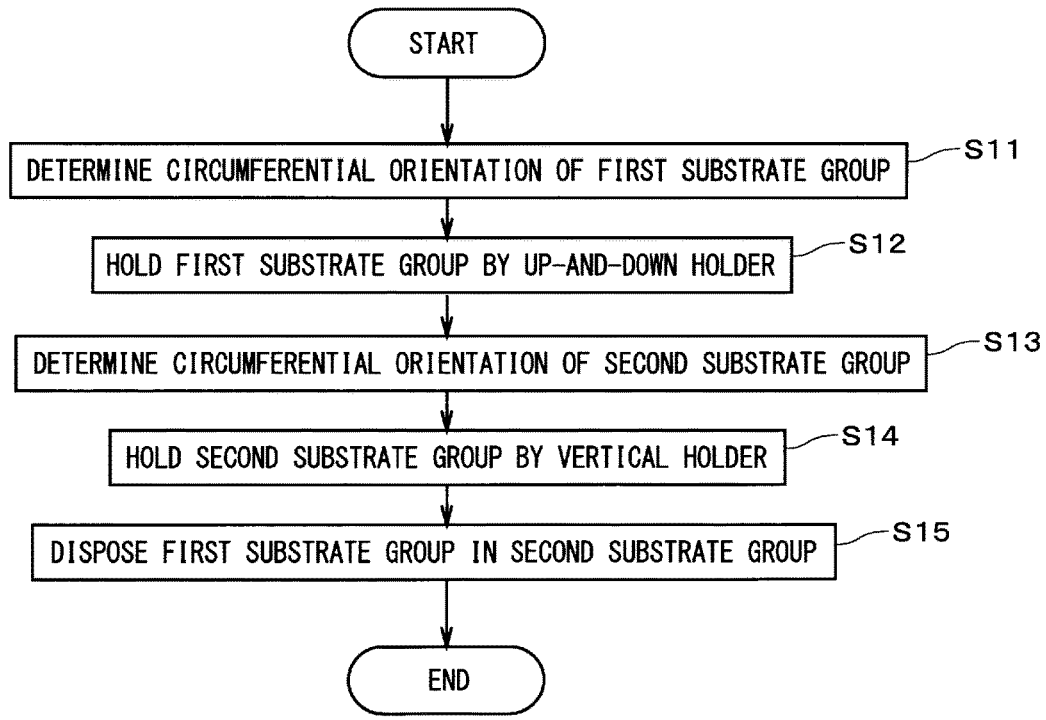
FIG. 7 is a flowchart illustrating a procedure for batch assembly.
Figure 8:
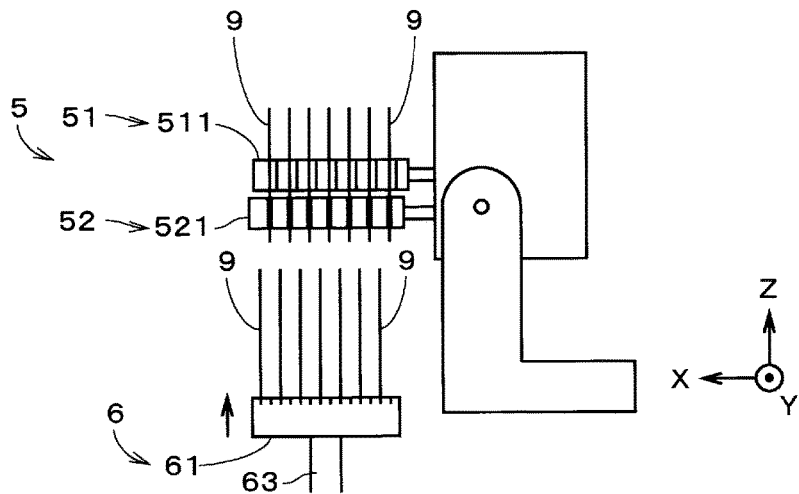
FIG. 8 is a side view illustrating movement of a posture changing mechanism and a pusher.
Figure 9:
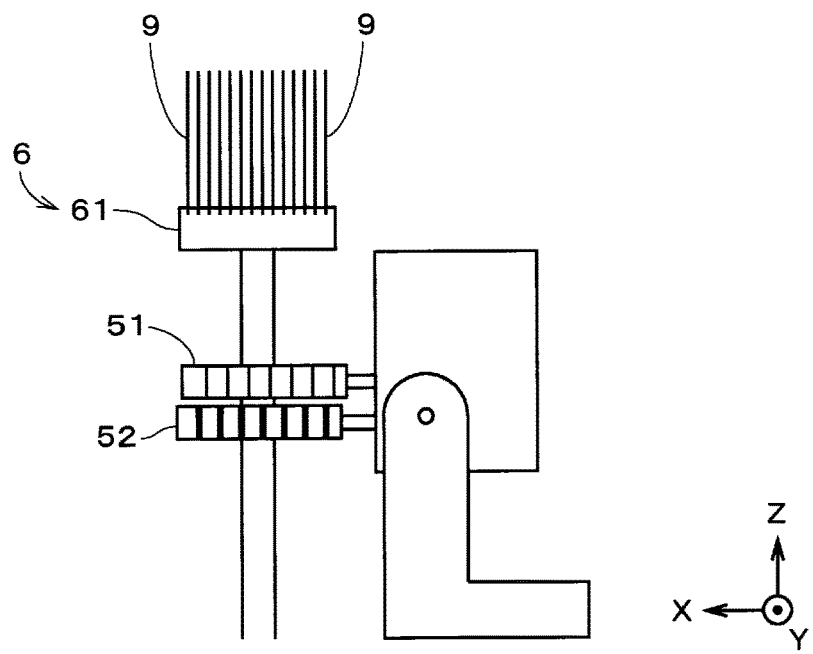
FIG. 9 is a side view illustrating the movement of the posture changing mechanism and the pusher.

As described above, in the substrate processing apparatus 10, the up-and-down holder 61 that holds the first substrate group carries out batch assembly in which the up-and-down holder 61 receives the second substrate group held by the posture changing mechanism 5. FIG. 7 is a flowchart illustrating a procedure for batch assembly. FIGS. 8 and 9 are side views illustrating movement of the posture changing mechanism 5 and the pusher 6 during batch assembly. In order to facilitate understanding of the drawings, the number of substrates 9 illustrated in FIGS. 8 and 9 is smaller than the actual number. Although FIGS. 8 and 9 illustrate the batch assembly of substrates 9 (i.e., first and second substrates 9) in the warped state illustrated in FIG. 4, the substrates 9 are illustrated as if they are not warped in FIGS. 8 and 9 in order to simplify the drawings.

In the substrate processing apparatus 10, the aforementioned substrate alignment mechanism 8 sequentially rotates the first substrates 9 in the first substrate group in the circumferential direction to determine the circumferential orientations of the substrates 9 (step S11). In other words, the first substrate group is aligned by the substrate alignment mechanism 8, and the circumferential position of the notch 93 (see FIG. 4) of each first substrate 9 is set to a desired position.

Then, the aligned first substrate group is transferred via the carry-in-and-out mechanism 4 and the posture changing mechanism 5 to the pusher 6. In the pusher 6, the first substrates 9 in the first substrate group are held by the up-and-down holder 61 that is a first holder (step S12). The up-and-down holder 61 holds lower edge portions of the first substrates 9 in a vertical posture, the first substrates 9 being arranged in the thickness direction. In the first substrate group that is just held by the up-and-down holder 61, the surfaces of the first substrates 9 are oriented in the +X direction. The up-and-down holder 61 that holds the first substrates 9 is horizontally rotated by 180 degrees about the rotation shaft 63 illustrated in FIG. 8. Thus, the positions in the stacking direction of the first substrates 9 are moved by the half pitch to the +X side. The surfaces of the first substrates 9 become oriented in the −X direction.

Next, the substrate alignment mechanism 8 sequentially rotates the second substrates 9 in the second substrate group in the circumferential direction to determine the circumferential orientations of the second substrates 9 (step S13). In other words, the second substrate group is aligned by the substrate alignment mechanism 8, and the circumferential position of the notch 93 (see FIG. 4) of each second substrate 9 is set to a desired position. The alignment of the second substrate group in step S13 may be performed in parallel with or before step S12 in which the up-and-down holder 61 holds the first substrate group, as long as it is performed after step S11.

The aligned second substrate group is transferred via the carry-in-and-out mechanism 4 to the posture changing mechanism 5. The posture changing mechanism 5 holds the second substrates 9 in a horizontal posture by the horizontal holder 51. Then, the posture of the second substrates 9 is changed from horizontal to vertical as illustrated in FIG. 8. Thus, the second substrates 9 are held by the vertical holder 52 that is a second holder (step S14). The vertical holder 52 holds the lower edge portions of the second substrates 9 in a vertical posture, the second substrates 9 being arranged in the thickness direction. In the second substrate group held by the vertical holder 52, the surfaces of the second substrates 9 are oriented in the +X direction. The second substrate group is located above (i.e., on the +Z side of) the first substrate group held by the up-and-down holder 61. The second substrate group is also located further to the −X side by the aforementioned half pitch than the first substrate group.

When the second substrate group is held by the vertical holder 52, the controller 100 (see FIG. 1) controls the holder elevating mechanism 62 (see FIG. 3) so as to move the up-and-down holder 61 upward and relatively approach the vertical holder 52 from the underside. The up-and-down holder 61 receives the plurality of substrates 9 in a vertical posture from the vertical holder 52 and holds the substrates 9 as illustrated in FIG. 9 while moving upward through the space between a pair of vertical support members 521 of the vertical holder 52 and between a pair of horizontal support members 511 of the horizontal holder 51. Accordingly, the first substrate group and the second substrate group are assembled into a batch and held by the up-and-down holder 61 of the pusher 6.

At the time of batch assembly, the first substrate group is inserted from the underside among the second substrate group, so that each of the first substrates 9 in the first substrate group are disposed between each pair of the second substrates 9 in the second substrate group. The first substrates 9 and the second substrates 9 are alternately disposed front-to-front and back-to-back (step S15). More specifically, the surfaces of the first substrates 9 are oriented in the −X direction as described above, and the surfaces of the second substrates 9 are oriented in the +X direction. In the substrate processing apparatus 10, the holder elevating mechanism 62 that moves the up-and-down holder 61 upward serves as a substrate arrangement mechanism for disposing each of the first substrates 9 between each pair of the second substrates 9. The up-and-down holder 61, the vertical holder 52, the substrate alignment mechanism 8, and the holder elevating mechanism 62 serve as a substrate arrangement apparatus for arranging a plurality of substrates 9.

Figure 10:
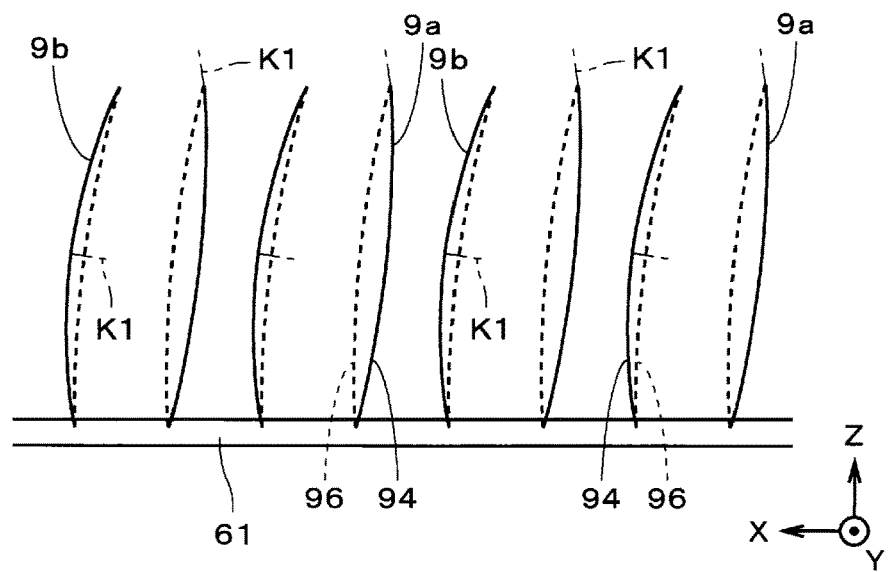
FIG. 10 is an enlarged side view of part of substrate groups assembled into a batch.

FIG. 10 is an enlarged side view of part of the first and second substrate groups assembled into a batch. In order to facilitate distinction between the first substrates in the first substrate group and the second substrates in the second substrate group, the first substrates and the second substrates are respectively indicated by 9a and 9b in FIG. 10. In FIG. 10, the outer peripheral edges 96 are indicated by broken lines in order to facilitate distinction between the surfaces 94 and the outer peripheral edges 96 of the first and second substrates 9a and 9b (the same applies to FIGS. 11 to 13). The up-and-down holder 61 holds the first substrates 9a and the second substrates 9b such that the outer peripheral edges 96 of the lower edge portions of the first and second substrates 9a and 9b become approximately parallel to the up-down direction.

In the substrate processing apparatus 10, the circumferential orientations of the first and second substrate groups are set to desired orientations in steps S11 and S13 described above. As a result, the first radial direction K1 of the first substrates 9a, each disposed between each pair of the second substrates 9b, is approximately orthogonal to the first radial direction K1 of the second substrates 9b. In other words, the substrate alignment mechanism 8 determines the circumferential orientations of the first and second substrate groups such that the first radial direction K1 of the first substrates 9a becomes approximately orthogonal to the first radial direction K1 of the second substrates 9b. The surfaces 94 of the first substrates 9a and the surfaces 94 of the second substrates 9b oppose each other in the X direction, and are spaced from each other with a sufficient gap. Note that the first radial direction K1 of the first substrates 9a does not necessarily have to be strictly orthogonal to the first radial direction K1 of the second substrates 9b, and may be substantially orthogonal to the first radial direction K1 of the second substrates 9b. In other words, the angle formed by the first radial direction K1 of the first substrates 9a and the first radial direction K1 of the second substrates 9b may be substantially 90°.

In the example illustrated in FIG. 10, the first radial direction K1 of the first substrates 9a points approximately in the up-down direction, and the first radial direction K1 of the second substrates 9b points approximately in the horizontal direction. Note that the first radial direction K1 of the first substrates 9a does not necessarily have to point strictly in the up-down direction, and may point substantially in the up-down direction. The first radial direction K1 of the second substrates 9b does not necessarily have to point strictly in the horizontal direction, and may point substantially in the horizontal direction.

Figure 11:
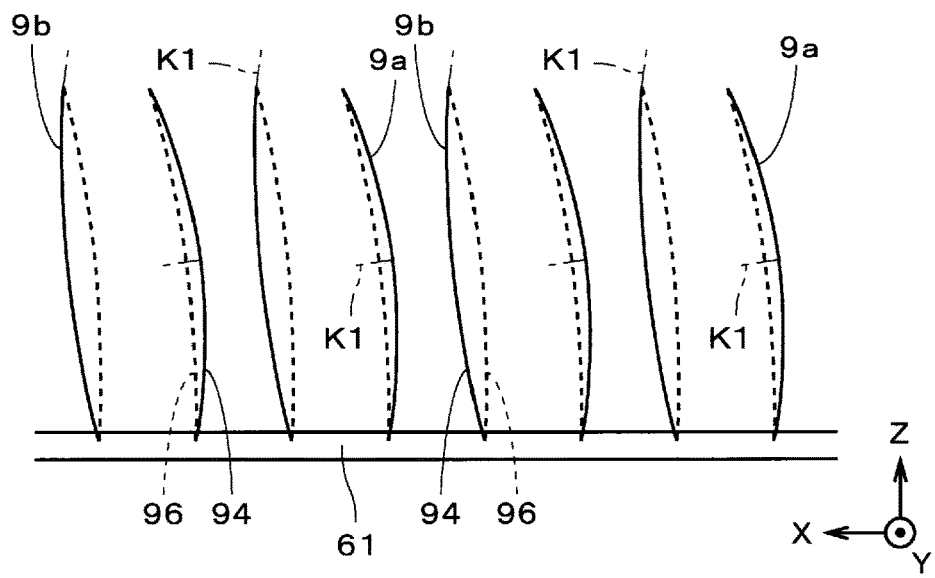
FIG. 11 is an enlarged side view of part of substrate groups assembled into a batch.

FIG. 11 illustrates another example in which the up-and-down holder 61 holds the first substrates 9a and the second substrates 9b with different orientations from those in the example in FIG. 10. In the example illustrated in FIG. 11, the first radial direction K1 of the first substrates 9a points approximately in the horizontal direction, and the first radial direction K1 of the second substrates 9b points approximately in the up-down direction. Note that the first radial direction K1 of the first substrates 9a does not necessarily have to point strictly in the horizontal direction, and may point substantially in the horizontal direction. The first radial direction K1 of the second substrates 9b does not necessarily have to point strictly in the up-down direction, and may point substantially in the up-down direction. The first radial direction K1 of the first substrates 9a, each disposed between each pair of the second substrates 9b, is approximately orthogonal to the first radial direction K1 of the second substrates 9b. Note that the first radial direction K1 of the first substrates 9a may be substantially orthogonal to the first radial direction K1 of the second substrates 9b. The surfaces 94 of the first substrates 9a and the surfaces 94 of the second substrates 9b oppose each other in the X direction, and are spaced from each other with a sufficient gap.

Figure 12:
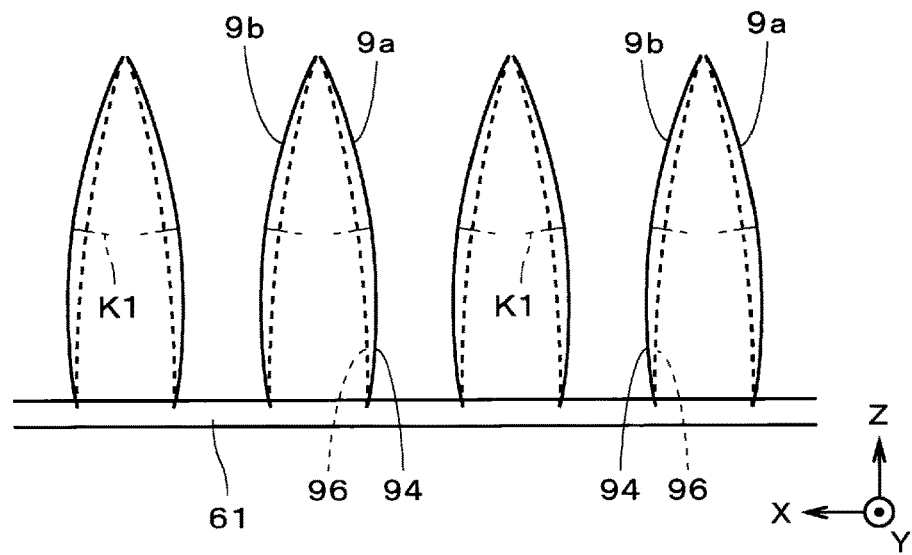
FIG. 12 is an enlarged side view of part of substrate groups assembled into a batch according to a comparative example.

FIG. 12 illustrates, as a comparative example to the present invention, an assumed case in which both of the first radial direction K1 of the first substrates 9a and the first radial direction K1 of the second substrates 9b point approximately in the horizontal direction. That is, in the comparative example illustrated in FIG. 12, the first radial direction K1 of the first substrates 9a and the first radial direction K1 of the second substrates 9b point approximately in the same direction. In the comparative example illustrated in FIG. 12, there is an extremely small distance in the X direction between the upper edge portion of each first substrate 9a and the upper edge portion of each second substrate 9b that is adjacent on the +X side to the first substrate 9a, and therefore, the first substrates 9a and the second substrates 9b may come into contact with one another. Such a small distance may also inhibit the flow of processing liquids between adjacent substrates and adversely affect the processing performed on the substrates during liquid chemical processing or other processing performed by the substrate processing part 2.

Figure 13:
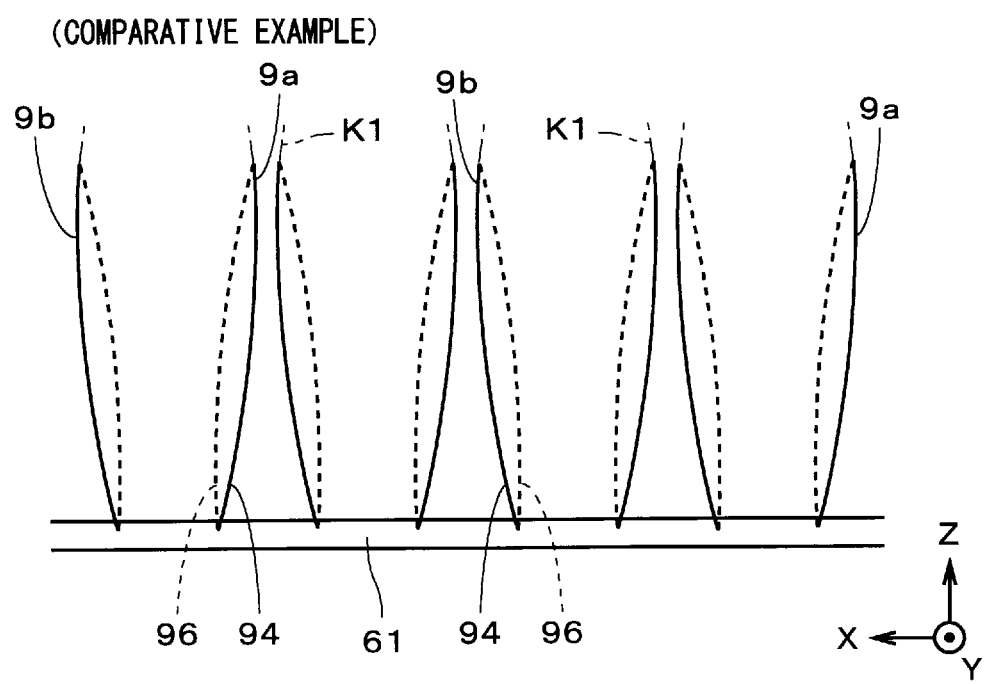
FIG. 13 is an enlarged side view of part of substrate groups assembled into a batch according to another comparative example.

FIG. 13 illustrates, as another comparative example to the present invention, an assumed case in which both of the first radial direction K1 of the first substrates 9a and the first radial direction K1 of the second substrates 9b point approximately in the up-down direction. That is, in the comparative example illustrated in FIG. 13, both of the first radial direction K1 of the first substrates 9a and the first radial direction K1 of the second substrates 9b point approximately in the same direction. In the comparative example illustrated in FIG. 13, there is an extremely small distance in the X direction between the upper edge portion of each first substrate 9a and the upper edge portion of each second substrates 9b that is adjacent on the −X side to the first substrate 9a, and therefore, the first substrates 9a and the second substrates 9b may come into contact with one another. Such a small distance may also inhibit the flow of processing liquids between adjacent substrates and adversely affect the processing performed on the substrates during liquid chemical processing or other processing performed by the substrate processing part 2 (see FIG. 1).

On the other hand, in the examples illustrated in FIGS. 10 and 11, a sufficient gap is ensured between the adjacent first and second substrates 9a and 9b by the substrate alignment mechanism 8, which determines the circumferential orientations of the first substrate group and the second substrate group. Thus, it is possible to prevent or suppress the contact between the first substrates 9a and the second substrate 9b. In the substrate processing apparatus 10, the substrate alignment mechanism 8 does not necessarily have to determine the orientations of both of the first substrate group and the second substrate group as long as the first radial direction K1 of the first substrates 9a becomes approximately orthogonal to the first radial direction K1 of the second substrates 9b, and it is sufficient for the substrate alignment mechanism 8 to determine the circumferential orientation of at least one of the first and second substrate groups. In this case, the substrate alignment mechanism 8 determines the circumferential orientation of at least one substrate group such that the first radial direction K1 of the at least one substrate group becomes approximately orthogonal to the first radial direction K1 of the other substrate group during batch assembly.

As described above, the aforementioned substrate arrangement apparatus includes the up-and-down holder 61 that is the first holder, the vertical holder 52 that is the second holder, the substrate alignment mechanism 8, and the holder elevating mechanism 62 that is the substrate arrangement mechanism. The up-and-down holder 61 holds the lower edge portions of the first substrates 9a in a vertical posture, the first substrates 9a being arranged in the thickness direction thereof. The vertical holder 52 holds the lower edge portions of the second substrates 9b in a vertical posture, the second substrates being arranged in the thickness direction thereof. The substrate alignment mechanism 8 rotates at least one substrate group, out of the first substrate group of the first substrates 9a and the second substrate group of the substrates 9b, in the circumferential direction to determine the circumferential orientation of the at least one substrate group. The holder elevating mechanism 62 that is a substrate arrangement mechanism brings the up-and-down holder 61 relatively close to the vertical holder 52 so as to dispose each of the first substrates 9a in the first substrate group between each pair of the second substrates 9b in the second substrate group, with the first substrates 9a and the second substrates 9b alternately disposed front-to-front and back-to-back.

Each substrate 9 in the first and second substrate groups (i.e., first substrates 9a and second substrates 9b) is curved in the first radial direction K1 to one side in the thickness direction with a minimum curvature, and is also curved in the second radial direction K2 orthogonal to the first radial direction K1 to the one side in the thickness direction with a maximum curvature. The first radial direction K1 of the first substrates 9a, each disposed between each pair of the second substrates 9b, is approximately orthogonal to the first radial direction K1 of the second substrates 9b. Thus, when the first substrates 9a and the second substrates 9b are alternately arranged as illustrated in FIGS. 10 and 11, it is possible to improve uniformity in the up-down direction of the distance in the arrangement direction between substrates adjacent to one another in the arrangement direction (i.e., distance in the thickness direction between the first substrates 9a and the second substrates 9b that are adjacent to each other in the thickness direction). As a result, it is possible to prevent or suppress the contact between the first substrates 9a and the second substrates 9b during operations such as batch assembly or transport of the substrates after batch assembly. Besides, it is possible to make the flow of processing liquids between the adjacent first and second substrates 9a and 9b close to the desired flow and thereby to allow the first and second substrates 9a and 9b to be processed suitably during operations such as liquid chemical processing performed by the substrate processing part 2.

As illustrated in FIG. 10, the first radial direction K1 of the first substrates 9a held by the up-and-down holder 61 points approximately in the up-down direction, and the first radial direction K1 of the second substrates 9b held by the vertical holder 52 points approximately in the horizontal direction. In other words, after steps S11 to S14 have completed, the first radial direction K1 of the first substrates 9a points approximately in the up-down direction, and the first radial direction K1 of the second substrates 9b points approximately in the horizontal direction. Then, the holder elevating mechanism 62 brings the up-and-down holder 61 close to the vertical holder 52 from the underside and inserts the first substrates 9a from the underside among the second substrates 9b. By pointing the first radial direction K1 of the first substrates 9a in the direction of relative movement of the first substrate group and the second substrate group during batch assembly in this way, it is possible to suitably prevent or further suppress the contact between the first substrates 9a and the second substrates 9b.

Also, as illustrated in FIG. 11, the first radial direction K1 of the first substrates 9a held by the up-and-down holder 61 points approximately in the horizontal direction, and the first radial direction K1 of the second substrates 9b held by the vertical holder 52 points approximately in the up-down direction. In other words, after steps S11 to S14 have completed, the first radial direction K1 of the first substrates 9a points approximately in the horizontal direction, and the first radial direction K1 of the second substrates 9b points approximately in the up-down direction. Then, the holder elevating mechanism 62 brings the up-and-down holder 61 close to the vertical holder 52 from the underside and inserts the first substrates 9a from the underside among the second substrates 9b. By pointing the first radial direction K1 of the second substrates 9b in the direction of relative movement of the first substrate group and the second substrate group during batch assembly in this way, it is possible to suitably prevent or further suppress the contact between the first substrates 9a and the second substrates 9b.

As described above, the substrate alignment mechanism 8 rotates both of the first and second substrate groups to determine the circumferential orientations of those substrate groups. This improves the degree of flexibility in settings when the circumferential orientations of the first and second substrate groups assembled into a batch are set in advance.

The substrate arrangement apparatus and the substrate processing apparatus 10 described above may be modified in various ways.

The substrate alignment mechanism 8 may be an apparatus having any of various types of structures as long as it is possible to rotate the substrates 9 in the circumferential direction to change the circumferential orientation of the substrates 9. For example, the substrate alignment mechanism 8 may be a mechanism for sequentially rotating substrates 9 in a vertical posture in the circumferential direction to change the circumferential orientation of the substrates 9. The substrate alignment mechanism 8 may also be a mechanism for simultaneously rotating a plurality of substrates 9 in the circumferential direction to change the circumferential orientation of each substrate 9. In the substrate alignment mechanism 8, the rotation of the substrates 9 may be stopped when the notches 93 of the substrates 9 engage with a predetermined engagement shaft.

For example, the substrate arrangement mechanism (i.e., holder elevating mechanism 62) may dispose each of the first substrates 9a between each pair of the second substrates 9b by moving the up-and-down holder 61 approximately horizontally to bring the up-and-down holder 61 close to the vertical holder 52. As another alternative, the substrate arrangement mechanism may move the vertical holder 62 to bring the up-and-down holder 61 relatively close to the vertical holder 52.

In the aforementioned substrate arrangement apparatus, the first radial direction K1 of the first substrates 9a, each disposed between each pair of the second substrates 9b, and the first radial direction K1 of the second substrates 9b may point in any direction as long as they become approximately orthogonal to each other.

For each substrate in the first and second substrate groups arranged by the aforementioned substrate arrangement apparatus, the first radial direction K1 that is curved with a minimum curvature and the second radial direction K2 that is curved with a maximum curvature do not necessarily have to become orthogonal to each other, and it is sufficient for the second radial direction K2 to intersect with the first radial direction K1 with an angle that is greater than or equal to 45 degrees and less than or equal to 135 degrees. Even if the substrates 9 are arranged as described above, it is possible, as described above, to improve uniformity in the up-down direction of the distance in the arrangement direction between substrates adjacent in the arrangement direction.

The aforementioned substrate arrangement apparatus does not necessarily have to be included in the substrate processing apparatus 10, and may be provided outside and independently of the substrate processing apparatus 10. The substrate arrangement apparatus may be incorporated into and used in various apparatuses other than the aforementioned substrate processing apparatus 10.

The substrate processing apparatus 10 may be used to process glass substrates used in display devices such as liquid crystal displays, plasma displays, and field emission displays (FEDs), instead of semiconductor substrates. The substrate processing apparatus 10 may also be used to process other substrates such as optical disk substrates, magnetic disk substrates, magneto-optical disk substrates, photomask substrates, ceramic substrates, and solar-cell substrates.

The configurations of the above-described preferred embodiments and variations may be appropriately combined as long as there are no mutual inconsistencies.

While the invention has been shown and described in detail, the foregoing description is in all aspects illustrative and not restrictive. It is therefore to be understood that numerous modifications and variations can be devised without departing from the scope of the invention. This application claims priority benefit under 35 U.S.C. Section 119 of Japanese Patent Application No. 2016-190862 filed in the Japan Patent Office on Sep. 29, 2016, the entire disclosure of which is incorporated herein by reference.

REFERENCE SIGNS LIST

8 Substrate alignment mechanism
9 Substrate
9a First substrate
9b Second substrate
52 Vertical holder
61 Up-and-down holder
62 Holder elevating mechanism
K1 First radial direction
K2 Second radial direction
S11 to S15 Step

The invention claimed is:

1. A substrate arrangement apparatus for arranging a plurality of substrates, comprising:
    a first holder for holding lower edge portions of a plurality of first substrates in a vertical posture, said plurality of first substrates being arranged in a thickness direction of said plurality of first substrates;
    a second holder for holding lower edge portions of a plurality of second substrates in a vertical posture, said plurality of second substrates being arranged in a thickness direction of said plurality of second substrates;
    a substrate supporter, a motor and a sensor for rotating at least one substrate group out of first and second substrate groups in a horizontal posture in a circumferential direction to determine a circumferential orientation of said at least one substrate group, said first substrate group consisting of said plurality of first substrates, and said second substrate group consisting of said plurality of second substrates; and
    a pusher for bringing said first holder relatively close to said second holder to dispose each of said plurality of first substrates in said first substrate group between each pair of said plurality of second substrates in said second substrate group,
    wherein each substrate in said first and second substrate groups is curved in a first radial direction to one side in the thickness direction with a minimum curvature, and
    said each substrate is curved in a second radial direction to said one side in the thickness direction with a maximum curvature, said second radial direction being orthogonal to said first radial direction with an angle that is greater than or equal to 45 degree and less than or equal to 135 degrees,
    wherein the substrate arrangement apparatus further comprises a controller for controlling said substrate supporter, said motor, said sensor and said pusher to dispose each of said plurality of first substrates between each pair of said plurality of second substrates, in a state that said first radial direction of said plurality of first substrates is orthogonal to said first radial direction of said plurality of second substrates.

2. The substrate arrangement apparatus according to claim 1, wherein
    said substrate supporter, said motor and said sensor rotates both of said first and second substrate groups in the circumferential direction to determine circumferential orientations of said first and second substrate groups.

3. The substrate arrangement apparatus according to claim 1, wherein
said first radial direction of said plurality of first substrates held by said first holder points in an up-down direction,
said first radial direction of said plurality of second substrates held by said second holder points in a horizontal direction, and
said pusher brings said first holder relatively close to said second holder from underside to insert said plurality of first substrates from the underside among said plurality of second substrates.

4. The substrate arrangement apparatus according to claim 1, wherein
said first radial direction of said plurality of first substrates held by said first holder points in a horizontal direction,
said first radial direction of said plurality of second substrates held by said second holder points in an up-down direction, and
said pusher brings said first holder relatively close to said second holder from underside to insert said plurality of first substrates from the underside among said plurality of second substrates.

5. The substrate arrangement apparatus according to claim 1, wherein
said pusher disposes each of said plurality of first substrates between each pair of said plurality of second substrates, with said plurality of first substrates and said plurality of second substrates alternately disposed front-to-front and back-to-back.

6. A substrate arrangement method for arranging a plurality of substrates, comprising:
a) holding lower edge portions of a plurality of first substrates in a vertical posture that are arranged in a thickness direction of said plurality of first substrates;
b) holding lower edge portions of a plurality of second substrates in a vertical posture that are arranged in a thickness direction of said plurality of second substrates;
c) rotating at least one substrate group out of first and second substrate groups in a circumferential direction to determine a circumferential orientation of said at least one substrate group, said first substrate group consisting of said plurality of first substrates, and said second substrate group consisting of said plurality of second substrates; and
d) disposing each of said plurality of first substrates in said first substrate group between each pair of said plurality of second substrates in said second substrate group, with said plurality of first substrates and said plurality of second substrates alternately disposed front-to-front and back-to-back,
wherein each substrate in said first and second substrate groups is curved in a first radial direction to one side in the thickness direction with a minimum curvature,
said each substrate is curved in a second radial direction to said one side in the thickness direction with a maximum curvature, said second radial direction being orthogonal to said first radial direction with an angle that is greater than or equal to 45 degrees and less than or equal to 135 degrees, and
in said operation d), said first radial direction of said plurality of first substrates, each disposed between each pair of said plurality of second substrates, is orthogonal to said first radial direction of said plurality of second substrates.

7. The substrate arrangement method according to claim 6, wherein
in said operation c), both of said first and second substrate groups are rotated in the circumferential direction to determine circumferential orientations of said first and second substrate groups.

8. The substrate arrangement method according to claim 6, wherein
after said operations a), b), and c) have completed, said first radial direction of said plurality of first substrates points in an up-down direction, and said first radial direction of said plurality of second substrates points in a horizontal direction, and
in said operation d), said plurality of first substrates are inserted from underside among said plurality of second substrates.

9. The substrate arrangement method according to claim 6, wherein
after said operations a), b), and c) have completed, said first radial direction of said plurality of first substrates points in a horizontal direction, and said first radial direction of said plurality of second substrates points in an up-down direction, and
in said operation d), said plurality of first substrates are inserted from underside among said plurality of second substrates.

10. A substrate arrangement apparatus for disposing each of a plurality of first substrates in a first substrate group between each pair of a plurality of second substrates in a second substrate group,
wherein each substrate in said first substrate group and said second substrate group is curved in a first radial direction to one side in the thickness direction with a minimum curvature, and
said each substrate is curved in a second radial direction to said one side in the thickness direction with a maximum curvature, said second radial direction being orthogonal to said first radial direction with an angle that is greater than or equal to 45 degree and less than or equal to 135 degrees,
wherein the substrate arrangement apparatus comprises
a controller for disposing each of said plurality of first substrates between each pair of said plurality of second substrates, in a state that said first radial direction of said plurality of first substrates is orthogonal to said first radial direction of said plurality of second substrates.

11. The substrate arrangement apparatus according to claim 10, further comprising:
a substrate supporter, a motor and a sensor for rotating at least one substrate group out of said first substrate group and said second substrate group in a circumferential direction to determine a circumferential orientation of said at least one substrate group.

12. The substrate arrangement apparatus according to claim 11, wherein
said substrate supporter, said motor and said sensor rotate said at least one substrate group in a horizontal posture to determine a circumferential orientation of said at least one substrate group.

13. The substrate arrangement apparatus according to claim 11, wherein
said substrate supporter, said motor and said sensor rotate both of said first and second substrate groups in the circumferential direction to determine circumferential orientations of said first substrate group and said second substrate group.

14. The substrate arrangement apparatus according to claim 10, further comprising:

a first holder for holding lower edge portions of said plurality of first substrates in a vertical posture, said plurality of first substrates being arranged in a thickness direction of said plurality of first substrates;

a second holder for holding lower edge portions of said plurality of second substrates in a vertical posture, said plurality of second substrates being arranged in a thickness direction of said plurality of second substrates; and a pusher for bringing said first holder relatively close to said second holder to dispose each of said plurality of first substrates in said first substrate group between each pair of said plurality of second substrates in said second substrate group, with said plurality of first substrates and said plurality of second substrates alternately disposed front-to-front and back-to-back.

15. The substrate arrangement apparatus according to claim 14, wherein said first radial direction of said plurality of first substrates held by said first holder points in an up-down direction, said first radial direction of said plurality of second substrates held by said second holder points in a horizontal direction, and said pusher brings said first holder relatively close to said second holder from underside to insert said plurality of first substrates from the underside among said plurality of second substrates.

16. The substrate arrangement apparatus according to claim 14, wherein said first radial direction of said plurality of first substrates held by said first holder points in a horizontal direction, said first radial direction of said plurality of second substrates held by said second holder points in an up-down direction, and said pusher brings said first holder relatively close to said second holder from underside to insert said plurality of first substrates from the underside among said plurality of second substrates.

17. A substrate arrangement method for disposing each of a plurality of first substrates in a first substrate group between each pair of a plurality of second substrates in a second substrate group, wherein each substrate in said first substrate group and said second substrate group is curved in a first radial direction to one side in the thickness direction with a minimum curvature, and said each substrate is curved in a second radial direction to said one side in the thickness direction with a maximum curvature, said second radial direction being orthogonal to said first radial direction with an angle that is greater than or equal to 45 degree and less than or equal to 135 degrees, wherein the substrate arrangement method comprises a) disposing each of said plurality of first substrates between each pair of said plurality of second substrates, in a state that said first radial direction of said plurality of first substrates is orthogonal to said first radial direction of said plurality of second substrates.

18. The substrate arrangement method according to claim 17, further comprising:

b) rotating at least one substrate group out of said first substrate group and said second substrate group in a circumferential direction to determine a circumferential orientation of said at least one substrate group.

19. The substrate arrangement method according to claim 18, wherein in said operation b), at least one substrate group is rotated in a horizontal posture to determine a circumferential orientation of said at least one substrate group.

20. The substrate arrangement method according to claim 18, wherein in said operation b), both of said first substrate group and said second substrate group are rotated in the circumferential direction to determine circumferential orientations of said first substrate group and said second substrate group.

21. The substrate arrangement method according to claim 18, further comprising:

before said operation b), c) holding lower edge portions of said plurality of first substrates in a vertical posture that are arranged in a thickness direction of said plurality of first substrates; and before said operation b), d) holding lower edge portions of said plurality of second substrates in a vertical posture that are arranged in a thickness direction of said plurality of second substrates, wherein in said operation a), each of said plurality of first substrates are disposed between each pair of said plurality of second substrates with said plurality of first substrates and said plurality of second substrates alternately disposed front-to-front and back-to-back.

22. The substrate arrangement method according to claim 21, wherein after said operations c), d), and b) have completed, said first radial direction of said plurality of first substrates points in an up-down direction, and said first radial direction of said plurality of second substrates points in a horizontal direction, and in said operation a), said plurality of first substrates are inserted from underside among said plurality of second substrates.

23. The substrate arrangement method according to claim 21, wherein after said operations c), d), and b) have completed, said first radial direction of said plurality of first substrates points in a horizontal direction, and said first radial direction of said plurality of second substrates points in an up-down direction, and in said operation a), said plurality of first substrates are inserted from underside among said plurality of second substrates.

* * * * *